(12) United States Patent
Kamichi

(10) Patent No.: US 11,260,769 B2
(45) Date of Patent: Mar. 1, 2022

(54) ELECTRIFIED VEHICLE

(71) Applicant: Toyota Jidosha Kabushiki Kaisha, Toyota (JP)

(72) Inventor: Kensuke Kamichi, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/599,549

(22) Filed: Oct. 11, 2019

(65) Prior Publication Data

US 2020/0130526 A1 Apr. 30, 2020

(30) Foreign Application Priority Data

Oct. 29, 2018 (JP) .............................. JP2018-202705

(51) Int. Cl.
| | |
|---|---|
| *B60L 53/62* | (2019.01) |
| *B60L 50/64* | (2019.01) |
| *G01R 31/367* | (2019.01) |
| *G01R 31/387* | (2019.01) |
| *B60L 3/00* | (2019.01) |

(52) U.S. Cl.
CPC .............. *B60L 53/62* (2019.02); *B60L 3/0046* (2013.01); *B60L 50/64* (2019.02); *G01R 31/367* (2019.01); *G01R 31/387* (2019.01); *B60L 2240/60* (2013.01)

(58) Field of Classification Search
CPC . B60L 53/62; B60L 3/00; B60L 50/64; G01R 31/367; G01R 31/387
See application file for complete search history.

(56) References Cited

U.S. PATENT DOCUMENTS

| | | | |
|---|---|---|---|
| 2011/0127958 A1* | 6/2011 | Ishishita | ............... B60W 20/13 320/109 |
| 2012/0086368 A1 | 4/2012 | Kawabuchi et al. | |
| 2018/0204393 A1* | 7/2018 | Landolsi | .............. F02M 35/021 |

FOREIGN PATENT DOCUMENTS

| | | |
|---|---|---|
| JP | 2012-085452 A | 4/2012 |
| WO | 2010005079 A1 | 1/2010 |

\* cited by examiner

*Primary Examiner* — Rexford N Barnie
*Assistant Examiner* — Elim Ortiz
(74) *Attorney, Agent, or Firm* — Dinsmore & Shohl LLP

(57) ABSTRACT

An electrified vehicle includes an electric motor configured to output power for traveling, an electric power storage device configured to supply electric power to the electric motor, and a control device configured to set an input limit as a maximum value of a charging current in charging the electric power storage device using electric power from an external power supply. The control device is configured to set a greater value as the input limit when a vehicle use ratio as a proportion of a use index indicating a degree of cumulative use of the vehicle to a prescribed maximum value of the use index is large than when the vehicle use ratio is small.

3 Claims, 6 Drawing Sheets

ELECTRIFIED VEHICLE

CROSS-REFERENCE TO RELATED APPLICATIONS

This application claims priority to Japanese Patent Application No. 2018-202705 filed on Oct. 29, 2018, which is incorporated herein by reference in its entirety including the specification, drawings and abstract.

BACKGROUND

1. Technical Field

The present disclosure relates to an electrified vehicle, and in particular, to an electrified vehicle including a control device that sets an input limit as a maximum value of a charging current in charging an electric power storage device using electric power from an external power supply.

2. Description of Related Art

In the related art, as this type of electrified vehicle, an electrified vehicle that sets a battery input electric power limit value in consideration of a degree of deterioration of a battery has been suggested (for example, see WO 2010/005079). In the vehicle, when the degree of deterioration of the battery is greater, the battery input electric power limit value is set to be smaller, whereby the progress of deterioration of the battery is suppressed.

SUMMARY

However, in the above-described electrified vehicle, in a case where the vehicle is used for many years, the degree of deterioration of the battery becomes large. Thus, the battery input electric power limit value is set to a small value from the need for suppressing the progress of deterioration. For this reason, it is not possible to make the battery sufficiently exhibit performance, and consequently, it is not possible to make the vehicle sufficiently exhibit performance.

An electrified vehicle of the present disclosure primarily aims to suppress degradation of performance of an electric power storage device even when the electric power storage device is used for many years.

In order to achieve the above-described primary object, the electrified vehicle of the present disclosure is implemented by an aspect described below.

An aspect of the present disclosure provides an electrified vehicle. The electrified vehicle includes an electric motor, an electric power storage device, and a control device. The electric motor is configured to output power for traveling. The electric power storage device is configured to supply electric power to the electric motor. The control device is configured to set an input limit as a maximum value of a charging current in charging the electric power storage device using electric power from an external power supply. The control device is configured to set a greater value as the input limit when a vehicle use ratio as a ratio of a use index indicating a degree of cumulative use of the vehicle to a prescribed maximum value of the use index is large than when the vehicle use ratio is small.

In the electrified vehicle according to the aspect of the present disclosure, the input limit as the maximum value of the charging current in charging the electric power storage device using electric power from the external power supply is set. At this time, when the vehicle use ratio as the ratio of the use index indicating the degree of cumulative use of the vehicle to the prescribed maximum value of the use index is large, the greater is set as the input limit than when the vehicle use ratio is small. With this, even in a vehicle that is used for many years and is shortened in lifetime, it is possible to suppress degradation of the performance of the electric power storage device, and consequently, it is possible to suppress degradation of the performance of the vehicle. Here, as the use index, a cumulative traveling distance or the number of years in use can be used. In this case, as the prescribed maximum value of the use index, 150,000 kilometers, 200,000 kilometers, or the like can be used in a case where the cumulative traveling distance is used as the use index, and 10 years, 15 years, or the like can be used in a case where the number of years in use are used as the use index.

In the electrified vehicle of the present disclosure, the control device may be configured to compute an actual capacity maintenance rate as a proportion of an actual full charge capacity to an initial value of a full charge capacity of the electric power storage device, apply the use index to a prescribed map to derive a target capacity maintenance rate such that, when the use index is greater, the target capacity maintenance rate becomes smaller, and set a smaller value as the input limit when a value obtained by subtracting the actual capacity maintenance rate from the target capacity maintenance rate is large than when the value is small. In this way, it is possible to set the input limit of the electric power storage device in consideration of a situation of previous use of the electrified vehicle. As a result, it is possible to more properly suppress degradation of the performance of the electric power storage device.

BRIEF DESCRIPTION OF THE DRAWINGS

Features, advantages, and technical and industrial significance of exemplary embodiments of the present disclosure will be described below with reference to the accompanying drawings, in which like numerals denote like elements, and wherein.

DETAILED DESCRIPTION OF EMBODIMENTS

Next, a mode for carrying out the present disclosure will be described in connection with an example.

Figure 1:
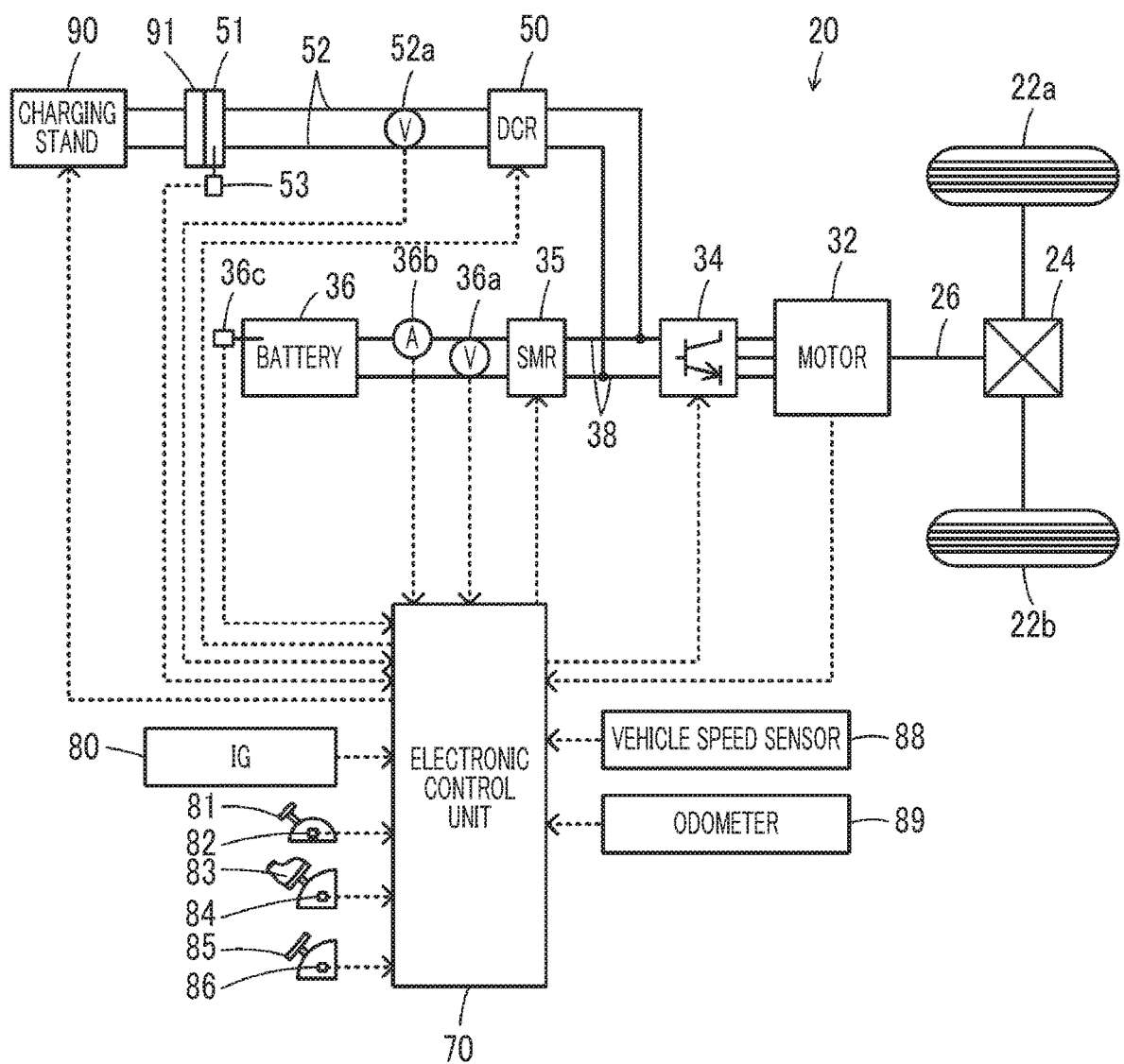
FIG. 1 is a configuration diagram showing the outline of the configuration of an electric vehicle 20 as an example of the present disclosure.

FIG. 1 is a configuration diagram showing the outline of the configuration of an electric vehicle 20 as an example of the present disclosure. As shown in FIG. 1, the electric vehicle 20 of the example includes a motor 32, an inverter 34, a battery 36 as a direct-current power supply, a relay for charging 50, and an electronic control unit 70.

The motor 32 is constituted as, for example, a synchronous motor generator, and has a rotor that is connected to a drive shaft 26 coupled to drive wheels 22a, 22b through a differential gear 24. The inverter 34 is used for the drive of the motor 32 and is connected to the battery 36 through a power line 38 and a system main relay 35. The motor 32 is rotationally driven through switching control of a plurality of switching elements (not shown) of the inverter 34 by the electronic control unit 70.

The battery 36 is constituted as, for example, a lithium-ion secondary battery or a nickel-hydrogen secondary battery, and exchanges electric power with the motor 32 through the system main relay 35 and the inverter 34. That is, power for driving is output from the motor 32 using electric power from the battery 36 through powering control of the motor 32, and the battery 36 is charged with regenerative electric power from the motor 32 through regenerative control of the motor 32.

The relay for charging 50 is provided in a power line 52 that connects a vehicle-side connector 51 connected to a stand-side connector 91 of a charging stand 90 outside the vehicle and the power line 38. Though not shown, the relay for charging 50 includes a positive electrode relay and a negative electrode relay.

Though not shown, the electronic control unit 70 is constituted as a microprocessor centering on a CPU, and includes, in addition to the CPU, a ROM that stores a processing program, a RAM that temporarily stores data, a flash memory, an input/output port, a communication port, and the like.

Signals from various sensors are input to the electronic control unit 70 through the input port. As the signals that are input to the electronic control unit 70, for example, a rotation position θm of the rotor of the motor 32 from a rotation position sensor (not shown) that detects the rotation position of the rotor of the motor 32, and phase currents Iu, Iv, Iw of respective phases of the motor 32 from a current sensor (not shown) that detects the phase currents of the respective phases of the motor 32 can be exemplified. A voltage Vb of the battery 36 from a voltage sensor 36a attached between terminals of the battery 36, a current Ib of the battery 36 from a current sensor 36b attached to an output terminal of the battery 36, and a temperature Tb of the battery 36 from a temperature sensor 36c attached to the battery 36 can also be exemplified. A connection detection signal from a connection detection sensor 53 that detects whether or not the vehicle-side connector 51 is connected to the stand-side connector 91, and a charging voltage Vchg from a voltage sensor 52a attached to the power line 52 between the vehicle-side connector 51 and the relay for charging 50 can also be exemplified. In addition, an ignition signal from an ignition switch 80, and a shift position SP from a shift position sensor 82 that detects an operation position of a shift lever 81 can also be exemplified. An accelerator operation amount Acc from an accelerator pedal position sensor 84 that detects a depression amount of an accelerator pedal 83, a brake pedal position BP from a brake pedal position sensor 86 that detects a depression amount from a brake pedal 85, a vehicle speed V from a vehicle speed sensor 88, a cumulative traveling distance Dist from an odometer 89, and the like can also be exemplified.

Various control signals are output from the electronic control unit 70 through the output port. As the signals that are output from the electronic control unit 70, for example, a control signal to the inverter 34, a control signal to the system main relay 35, and a control signal to the relay for charging 50 can be exemplified. Information (a charging input limit Ichg or the like in charging the battery 36) needed for charging that is input to the charging stand 90 through a communication line of the vehicle-side connector 51 and the stand-side connector 91 when the vehicle-side connector 51 is connected to the stand-side connector 91 can also be exemplified. The electronic control unit 70 computes an electric power storage amount Cb or a state of charge SOC of the battery 36 based on an integrated value of an input/output current Ib of the battery 36 from the current sensor 36b. Here, the electric power storage amount Cb is an amount of electric power dischargeable from the battery 36, and the state of charge SOC is a proportion of the electric power storage amount Cb to a total capacity Cap of the battery 36.

In the electric vehicle 20 of the example configured as above, the electronic control unit 70 sets requested torque Td* requested for traveling (requested for the drive shaft 26) based on the accelerator operation amount Acc and the vehicle speed V, sets the requested torque Td* as a torque command Tm* of the motor 32, and performs the switching control of the switching elements of the inverter 34 such that the motor 32 is driven with the torque command Tm*.

In the electric vehicle 20 of the example, in a case where the vehicle-side connector 51 and a facility-side connector are connected during parking at home or a charging facility, such as the charging stand 90 (in a case where connection of the vehicle-side connector 51 and the facility-side connector is detected by the connection detection sensor 53), the battery 36 is charged using electric power from the charging facility.

Figure 2:
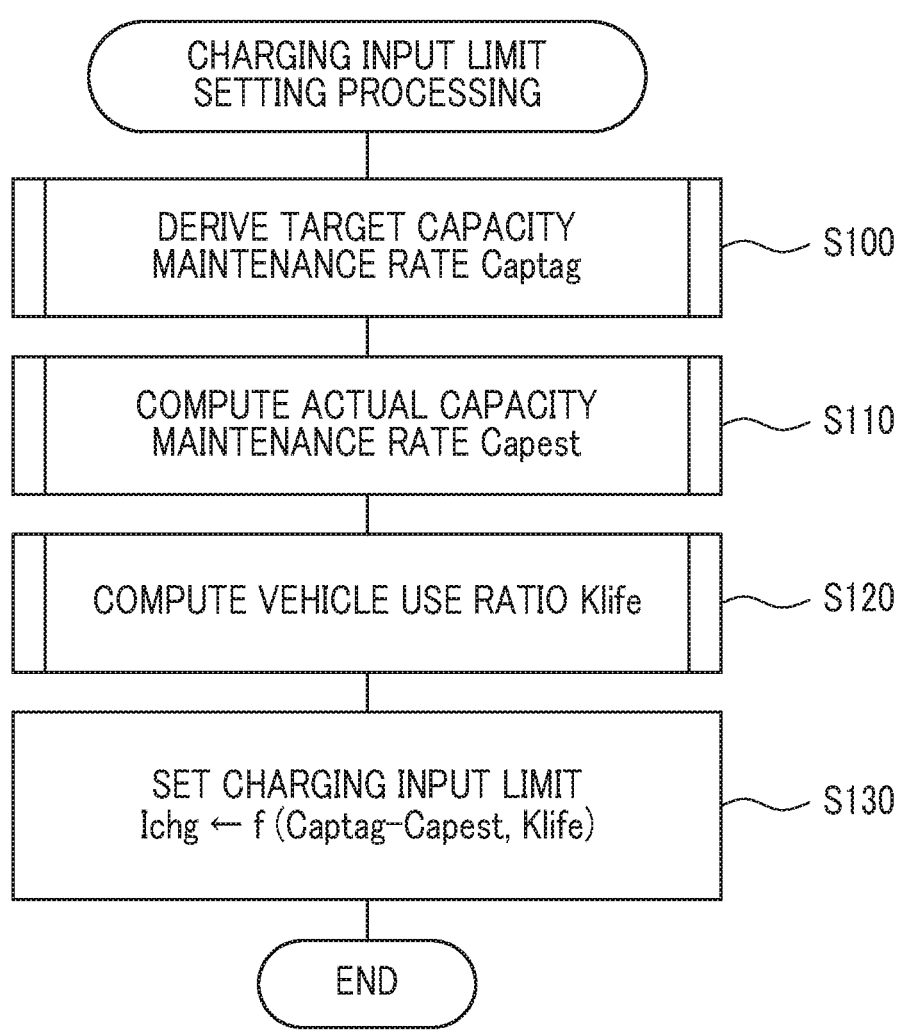
FIG. 2 is a flowchart showing an example of charging input limit setting processing that is executed by an electronic control unit 70.

Next, the operation of the electric vehicle 20 configured as above, and in particular, an operation in a case where the charging input limit Ichg of the battery 36 is set in performing rapid charging with comparatively large electric power by the charging stand 90 will be described. FIG. 2 is a flowchart showing an example of charging input limit setting processing that is executed by the electronic control unit 70. The processing is executed when the vehicle-side connector 51 is connected to the stand-side connector 91 of the charging stand 90.

Figure 3:
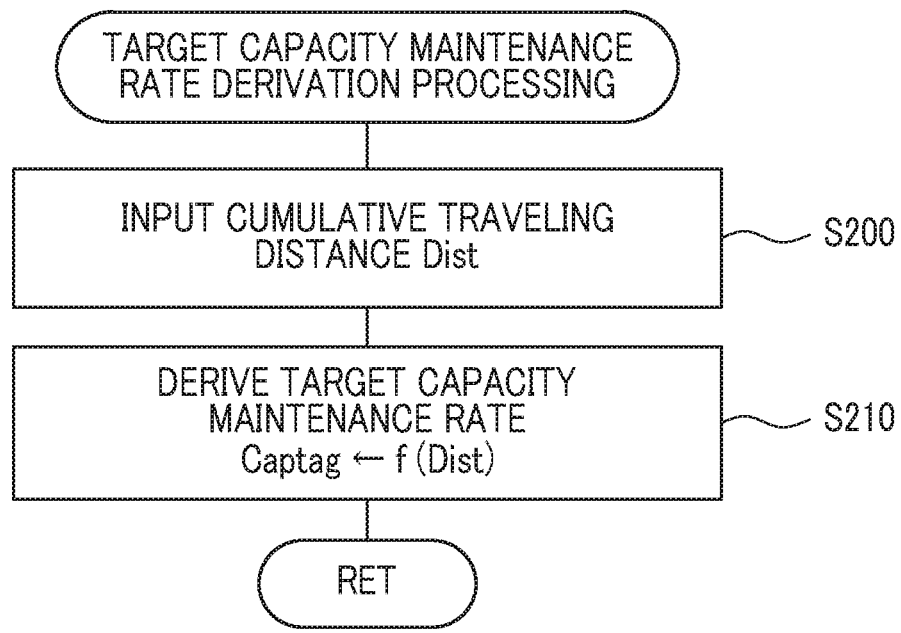
FIG. 3 is a flowchart showing an example of target capacity maintenance rate derivation processing.
Figure 4:
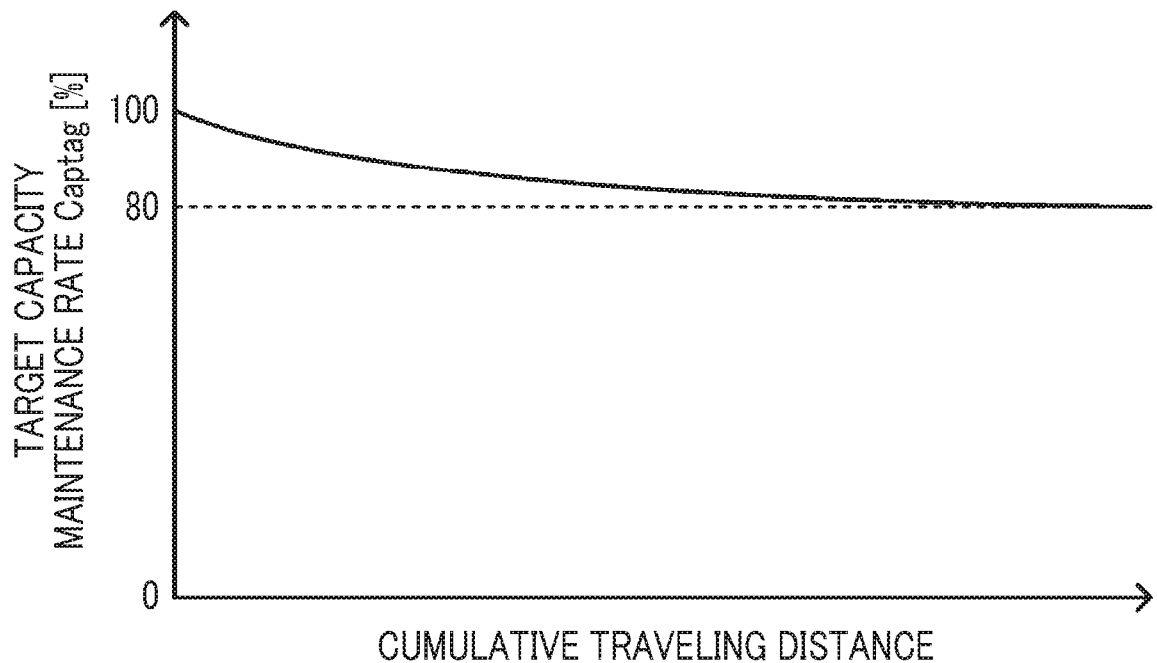
FIG. 4 is an explanatory view showing an example of a map for target capacity maintenance rate derivation.

In a case where the charging input limit setting processing is executed, the electronic control unit 70 first executes processing for deriving a target capacity maintenance rate Captag (Step S100). The target capacity maintenance rate Captag is a maintenance rate of the total capacity as a target value to be maintained even with degradation due to subsequent use of the vehicle when the maintenance rate of the total capacity (full charge capacity) as an initial value of the battery 36 is set as 100%. The processing for deriving the target capacity maintenance rate Captag is executed by target capacity maintenance rate derivation processing illustrated in FIG. 3. That is, the cumulative traveling distance Dist from the odometer 89 is input (Step S200), and the input cumulative traveling distance Dist is applied to a map for target capacity maintenance rate derivation to derive the target capacity maintenance rate Captag (Step S210). FIG. 4 shows an example of the map for target capacity maintenance rate derivation. As shown in FIG. 4, the target capacity maintenance rate Captag becomes smaller from the initial value of 100% when the cumulative traveling distance Dist becomes greater, and is determined so as to approach a given value (for example, 80%).

Figure 5:
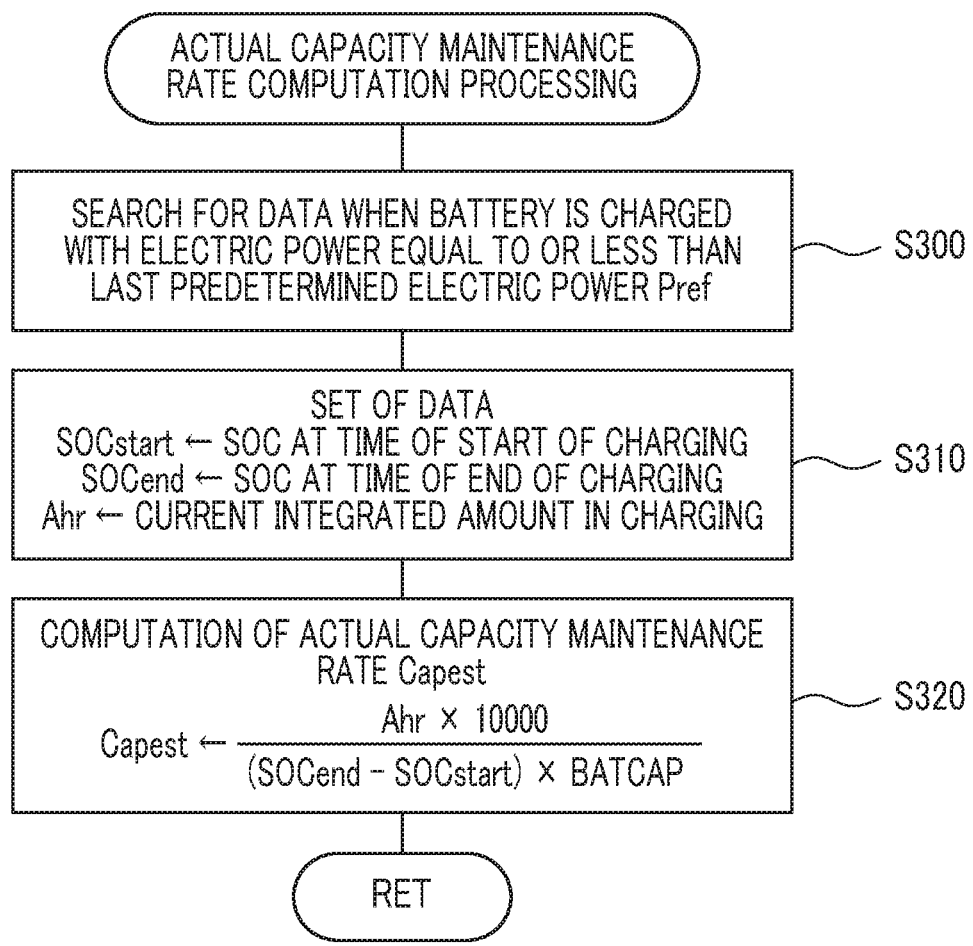
FIG. 5 is a flowchart showing an example of actual capacity maintenance rate computation processing.

Next, an actual capacity maintenance rate Capest is computed (Step S110). The actual capacity maintenance rate Capest is an actual maintenance rate of the total capacity of the battery 36 at the present time when the maintenance rate of the total capacity (full charge capacity) as the initial value of the battery 36 is set as 100%. The computation of the actual capacity maintenance rate Capest is executed by actual capacity maintenance rate computation processing illustrated in FIG. 5. That is, first, search for data when the battery 36 is charged with electric power equal to or less than last predetermined electric power Pref is performed (Step S300). The predetermined electric power Pref is a threshold value in searching for data in a case of charging with comparatively low electric power, and electric power, such as 50% or 40% of allowable maximum charging electric power, can be used as the predetermined electric power Pref. Subsequently, the state of charge SOC at the time of the start of charging included in the searched data is set as a start proportion SOCstart, the state of charge SOC at the time of the end of charging is set as an end proportion SOCend, and a current integrated value in charging is set as a charging current integrated value Ahr (Step S310). Then, the actual capacity maintenance rate Capest is computed by Expression (1) described below (Step S320). In Expression (1), "BATCAP" is the total capacity (full charge capacity) as the initial value of the battery 36, and "10000" is a coefficient for converting the actual capacity maintenance rate Capest in percent (%). In Expression (1), the actual capacity maintenance rate Capest is computed by multiplying a value obtained by subtracting the start proportion SOCstart from the end proportion SOCend by BATCAP, dividing the charging current integrated value Ahr by the multiplication result, and multiplying the division result by the coefficient (10000).

$$Capest \leftarrow \frac{Ahr \times 10000}{(SOCend - SOCstart) \times BATCAP} \quad (1)$$

Figure 6:
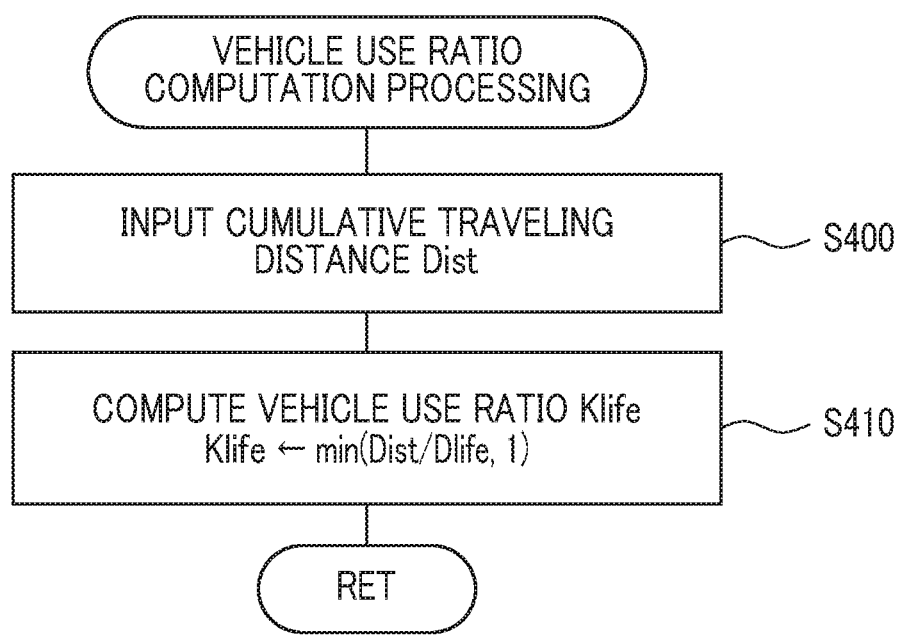
FIG. 6 is a flowchart showing an example of vehicle use ratio computation processing.

Subsequently, a vehicle use ratio Klife is computed (Step S120). The vehicle use ratio Klife is a proportion of previous use to an assumed vehicle use limit (vehicle lifetime). The computation of the vehicle use ratio Klife is performed by vehicle use ratio computation processing illustrated in FIG. 6. That is, the cumulative traveling distance Dist from the odometer 89 is input (Step S400), and a smaller value between a value obtained by dividing the input cumulative traveling distance Dist by a cumulative traveling distance limit Dlife as the vehicle use limit (vehicle lifetime) and a value of one is set as the vehicle use ratio Klife (Step S410). Here, the setting is performed such that the vehicle use ratio Klife does not exceed the value of one when the cumulative traveling distance Dist exceeding the cumulative traveling distance limit Dlife. Normally, since the cumulative traveling distance Dist is less than the cumulative traveling distance limit Dlife, the vehicle use ratio Klife is set to a value smaller than the value of one.

Figure 7:
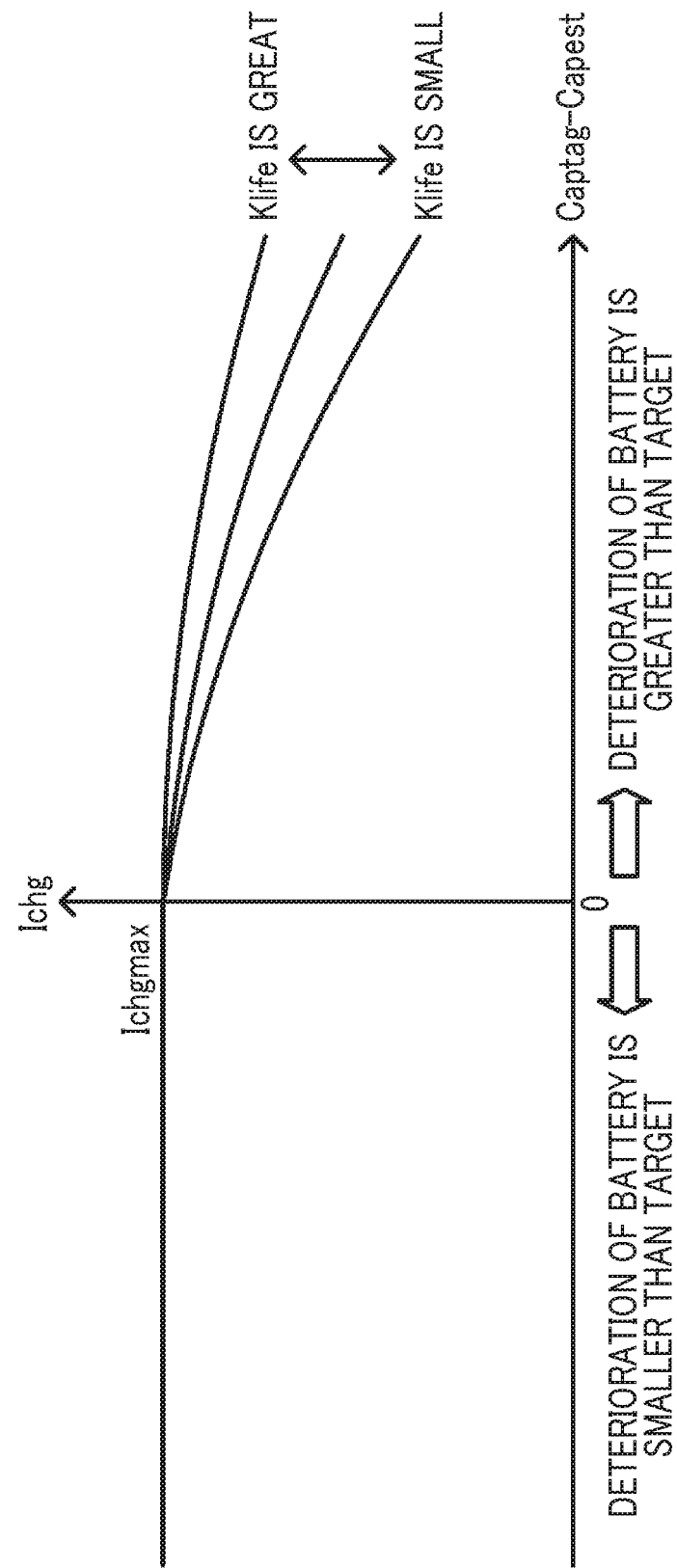
FIG. 7 is an explanatory view showing an example of a map for charging input limit setting.

Then, a value obtained by subtracting the actual capacity maintenance rate Capest from the target capacity maintenance rate Captag and the vehicle use ratio Klife are applied to a map for charging input limit setting to set the charging input limit Ichg (Step S130). FIG. 7 shows an example of the map for charging input limit setting. In the map shown in FIG. 7, when the value obtained by subtracting the actual capacity maintenance rate Capest from the target capacity maintenance rate Captag is in a negative region, deterioration of the battery 36 is smaller than a target level (is not in progress). For this reason, a charging allowable maximum input limit Ichgmax prescribed to the battery 36 is set as the charging input limit Ichg. When the value obtained by subtracting the actual capacity maintenance rate Capest from the target capacity maintenance rate Captag is in a positive region, deterioration of the battery 36 is greater than the target level (is in progress). For this reason, the charging input limit Ichg is set to a value smaller than the charging allowable maximum input limit Ichgmax. At this time, the charging input limit Ichg is set to a value that becomes smaller when the value obtained by subtracting the actual capacity maintenance rate Capest from the target capacity maintenance rate Captag is greaten. This is to set the charging input limit Ichg depending on the degree of process of deterioration of the battery 36. Furthermore, the charging input limit Ichg is set to a greater value when the vehicle use ratio Klife is greater (when the vehicle lifetime is shorter). This is to suppress degradation of the performance of the battery 36 even though the vehicle is used for many years, and to suppress degradation of the performance of the vehicle. That is, the reason is because it is considered that, when the vehicle lifetime (battery lifetime) is short, excellent user-friendliness is achieved by suppressing degradation of the performance of the battery 36 even though deterioration of the battery 36 progresses.

The charging input limit Ichg set as described above is transmitted to the charging stand 90 and is used in charging the battery 36 with electric power from the charging stand 90. That is, at the time of rapid charging, the battery 36 is charged with electric power to be the charging input limit Ichg from the charging stand 90.

In the electric vehicle 20 of the example described above, when the vehicle use ratio Klife is greater (when the vehicle lifetime is shorter), the greater value is set as the charging input limit Ichg. With this, it is possible to suppress degradation of the performance of the battery 36 even though the vehicle is used for many years, and consequently, it is possible to suppress degradation of the performance of the vehicle. Furthermore, the value that becomes smaller when the value obtained by subtracting the actual capacity maintenance rate Capest from the target capacity maintenance rate Captag is greater is set as the charging input limit Ichg. With this, it is possible to set the charging input limit Ichg depending on the degree of progress of deterioration of the battery 36. As a result, it is possible to more properly suppress degradation of the performance of the battery 36.

In the electric vehicle 20 of the example, normally, the vehicle use ratio Klife is computed as the value obtained by dividing the cumulative traveling distance Dist by the cumulative traveling distance limit Dlife. The number of years in use of the vehicle may be used instead of the cumulative traveling distance Dist. In this case, as the cumulative traveling distance limit Dlife, the prescribed number of life years (for example, 10 years, 15 years, or the like) may be used. Furthermore, in this case, the number of years in use of the vehicle is used instead of the cumulative traveling distance Dist for the processing for deriving the target capacity maintenance rate Captag in some embodiments. Here, since it is considered that the cumulative traveling distance Dist or the number of years in use of the vehicle is a use index indicating the degree of cumulative use of the vehicle, any value other than the cumulative traveling distance Dist or the number of years in use of the vehicle may be used as long as the value indicates the degree of cumulative use of the vehicle.

In the electric vehicle 20 of the example, although the battery 36 constituted as a lithium-ion secondary battery or a nickel-hydrogen secondary battery is mounted, an electric power storage device, such as a lead storage battery, may be mounted.

In the example, although a case where the present disclosure is applied to the electric vehicle 20 has been described, the present disclosure may be applied to an automobile, in which a battery capable of being charged with electric power from the charging stand 90, for example, a so-called plug-in hybrid automobile.

The correspondence relationship between the primary components of the example and the primary components of the present disclosure described in SUMMARY will be described. In the example, the motor 32 corresponds to an "electric motor", the battery 36 corresponds to an "electric power storage device", and the electronic control unit 70 corresponds to a "control device".

The correspondence relationship between the primary components of the example and the primary components of the present disclosure described in SUMMARY should not be considered to limit the components of the present disclosure described in SUMMARY since the example is solely illustrative to specifically describe the aspects of the present disclosure. That is, the present disclosure described in SUMMARY should be interpreted based on the description in SUMMARY, and the example is merely a specific example of the present disclosure described in SUMMARY.

Although the mode for carrying out the present disclosure has been described above in connection with the example, the applicable embodiment is not limited to the example, and can be of course carried out in various forms without departing from the spirit and scope of the present disclosure.

The present disclosure is usable in a manufacturing industry of an electrified vehicle, or the like.

What is claimed is:

1. An electrified vehicle comprising:
an electric motor configured to output power for traveling;
an electric power storage device configured to supply electric power to the electric motor; and
a control device configured to set an input limit as a maximum value of a charging current in charging the electric power storage device using electric power from an external power supply,
wherein the control device is configured to:
set a greater value as the input limit when a vehicle use ratio as a ratio of a use index indicating a degree of cumulative use of the vehicle to a prescribed maximum value of the use index is large than when the vehicle use ratio is small, and
compute an actual capacity maintenance rate as a proportion of an actual full charge capacity to an initial value of a full charge capacity of the electric power storage device, apply the use index to a prescribed map to derive a target capacity maintenance rate such that, when the use index is greater, the target capacity maintenance rate becomes smaller, and set a smaller value as the input limit when a value obtained by subtracting the actual capacity maintenance rate from the target capacity maintenance rate is large than when the value is small.

2. The electrified vehicle according to claim 1, wherein the control device is an electronic control unit.

3. The electrified vehicle according to claim 1, wherein the prescribed maximum value is a maximum traveling distance associated with the vehicle.

* * * * *